US009799740B2

(12) United States Patent
Park et al.

(10) Patent No.: US 9,799,740 B2
(45) Date of Patent: Oct. 24, 2017

(54) THIN FILM TRANSISTOR AND THIN FILM TRANSISTOR SUBSTRATE INCLUDING THE SAME

(71) Applicant: Samsung Display Co., Ltd., Yongin-Si, Gyeonggi-Do (KR)

(72) Inventors: Junhyun Park, Yongin-si (KR); Sunghwan Kim, Yongin-si (KR); Seyoung Song, Yongin-si (KR); Kyoungju Shin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/989,923

(22) Filed: Jan. 7, 2016

(65) Prior Publication Data

US 2016/0380064 A1  Dec. 29, 2016

(30) Foreign Application Priority Data

Jun. 25, 2015   (KR) .................. 10-2015-0090492

(51) Int. Cl.
| | |
|---|---|
| *H01L 29/15* | (2006.01) |
| *H01L 29/417* | (2006.01) |
| *H01L 27/12* | (2006.01) |
| *H01L 29/786* | (2006.01) |
| *H01L 29/10* | (2006.01) |

(52) U.S. Cl.
CPC ...... *H01L 29/41733* (2013.01); *H01L 27/124* (2013.01); *H01L 29/1033* (2013.01); *H01L 29/7869* (2013.01); *H01L 29/78618* (2013.01); *H01L 29/78669* (2013.01); *H01L 29/78678* (2013.01)

(58) Field of Classification Search
CPC ............. H01L 27/124; H01L 29/41733; H01L 29/7869; H01L 29/78618; H01L 29/78678; H01L 29/1033; H01L 29/78669
USPC ............................................ 257/72
See application file for complete search history.

(56) References Cited

U.S. PATENT DOCUMENTS

| | | | |
|---|---|---|---|
| 2005/0162579 A1* | 7/2005 | Jeong ............... | H01L 27/124 349/43 |
| 2011/0284836 A1* | 11/2011 | Lee .................. | H01L 29/45 257/43 |
| 2012/0096928 A1* | 4/2012 | Occhipinti ......... | G01N 27/4141 73/31.06 |
| 2014/0120657 A1 | 5/2014 | Hung et al. | |
| 2015/0129882 A1* | 5/2015 | Jiang ............... | H01L 29/41733 257/72 |

FOREIGN PATENT DOCUMENTS

| | | |
|---|---|---|
| KR | 1020040061375 A | 7/2004 |
| KR | 1020060102172 A | 9/2006 |
| KR | 1020130098655 A | 9/2013 |

* cited by examiner

*Primary Examiner* — Vongsavanh Sengdara
(74) *Attorney, Agent, or Firm* — Cantor Colburn LLP

(57) ABSTRACT

A thin film transistor substrate includes: a substrate; and a thin film transistor including a gate electrode on the substrate, an active layer on the gate electrode, and a source electrode and a drain electrode on the active layer. Within the thin film transistor, at least one of the source electrode and the drain electrode defines a plurality of branch electrodes thereof and a main electrode to which the plurality of branch electrodes is commonly connected. Each of the plurality of branch electrodes overlaps the gate electrode.

16 Claims, 5 Drawing Sheets

THIN FILM TRANSISTOR AND THIN FILM TRANSISTOR SUBSTRATE INCLUDING THE SAME

This application claims priority to Korean Patent Application No. 10-2015-0090492, filed on Jun. 25, 2015, and all the benefits accruing therefrom under 35 U.S.C. §119, the contents of which in their entirety are herein incorporated by reference.

BACKGROUND

1. Field

One or more exemplary embodiments relate to a thin film transistor.

2. Description of the Related Art

Generally, a thin film transistor ("TFT") is used for driving a pixel or operating a peripheral circuit in a flat panel display device. The TFT includes a gate electrode, a source electrode, a drain electrode and an active pattern between the source electrode and the drain electrode. The active pattern includes a semiconductor layer including amorphous silicon, polysilicon or an oxide semiconductor. A capacitive load may increase due to parasitic capacitance between a gate electrode and a source electrode of the TFT and thus kickback may increase and a resistive-capacitive ("RC") delay may increase.

SUMMARY

According to one or more exemplary embodiments, a thin film transistor substrate includes: a substrate; and a thin film transistor including a gate electrode on the substrate, an active layer on the gate electrode, and a source electrode and a drain electrode on the active layer. Within the thin film transistor, at least one of the source electrode and the drain electrode defines a branch electrode thereof in plural and a main electrode thereof to which the branch electrodes are commonly connected, and branch electrode among the branch electrodes overlaps the gate electrode.

The branch electrodes may be spaced apart from each other by at least about 1 micrometer (µm) in a channel width direction of the thin film transistor.

The branch electrodes may be spaced apart from each other by at least about 2 µm in a channel width direction of the thin film transistor.

Within the thin film transistor, the active layer may define in a channel width direction of the thin film transistor, main channel regions thereof having channel widths respectively defined by widths of the branch electrodes, and parasitic channel regions thereof defined between the main channel regions.

Within the thin film transistor, the source electrode may define a source branch electrode thereof provided in plural and a source main electrode thereof to which the source branch electrodes are commonly connected.

Within the thin film transistor, the drain electrode may define a drain branch electrode thereof provided in plural and a drain main electrode thereof to which the drain branch electrodes are commonly connected.

The thin film transistor substrate may further include: a pixel including the thin film transistor and a pixel electrode connected to the source electrode; and a data line which is connected to the drain electrode and applies a data voltage to the pixel.

The thin film transistor substrate may further include: a data line connected to the source electrode; and a plurality of pixels connected to the data line.

According to one or more exemplary embodiments, a thin film transistor substrate includes: a substrate; a selection thin film transistor including a gate electrode on the substrate, an active layer on the gate electrode, and a source electrode and a drain electrode on the active layer; a control line which extends along a first direction on the substrate and controls the selection thin film transistor; an active layer extending along a second direction that is different from the first direction, a portion of the active layer overlapping the control line defining a channel region of the active layer; and a data line on the active layer and extending along the second direction, portions of the data line defining a drain electrode and a source electrode spaced apart from each other at the channel region. Within the selection thin film transistor, a first width of the source electrode in the first direction is less than a second width of the drain electrode in the first direction.

The first width may be less than the second width by at least about 1 µm.

The first width may be less than the second width by at least about 2 µm.

The portion of the active layer overlapping the control line may define a predetermined width of the active layer along the second direction.

The thin film transistor substrate may further include a plurality of pixels each connected to the data line.

According to one or more exemplary embodiments, a thin film transistor substrate includes: a substrate; and a thin film transistor including a gate electrode on the substrate, an active layer on the gate electrode, and a source electrode and a drain electrode on the active layer. Within the thin film transistor, the source electrode defines a terminal end thereof which overlaps both the gate electrode and the active layer. At the terminal end of the source electrode, the active layer extends further than at least one side of the terminal end of the source electrode by at least about 1 µm in a channel width direction of the thin film transistor.

At the terminal end of the source electrode, the active layer may extend further than both of opposing sides of the terminal end of the source electrode by at least about 1 µm in the channel width direction.

At the terminal end of the source electrode, the active layer may extend further than at least one side of the terminal end of the source electrode by at least about 2 µm in the channel width direction.

Within the thin film transistor, the active layer may define in a channel width direction of the thin film transistor, a main channel region thereof having a width defined by a width of the terminal end of the source electrode and a parasitic channel region thereof disposed adjacent to the main channel region and having a width of at least about 1 µm.

The thin film transistor substrate may further include: a pixel including the thin film transistor and a pixel electrode connected to the source electrode; and a data line which is connected to the drain electrode and applies a data voltage to the pixel.

BRIEF DESCRIPTION OF THE DRAWINGS

These and/or other features will become apparent and more readily appreciated from the following description of the exemplary embodiments, taken in conjunction with the accompanying drawings in which.

DETAILED DESCRIPTION

Figure 1:
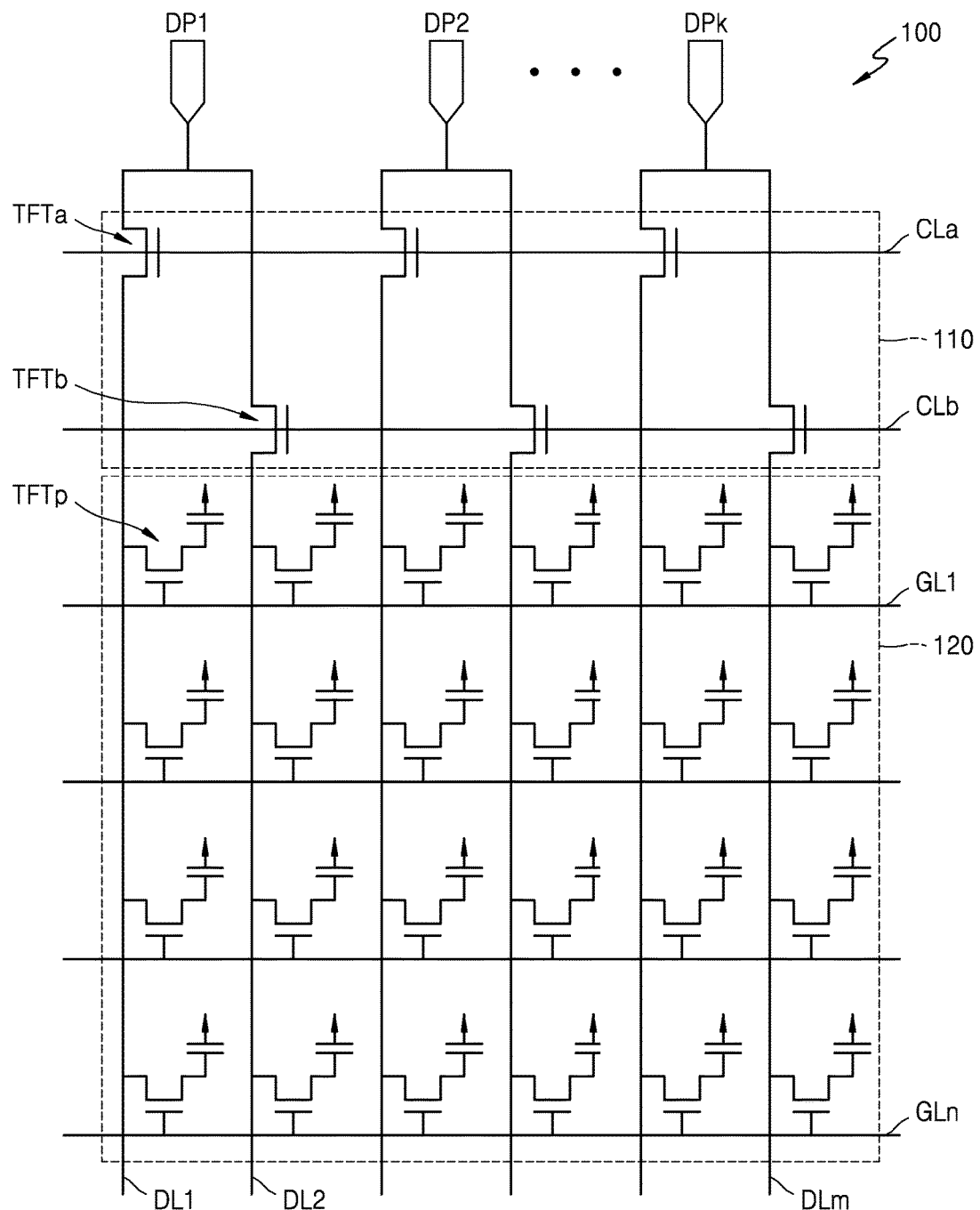
FIG. 1 is a block diagram illustrating an exemplary embodiment of a thin film transistor substrate according to the invention.

As the invention allows for various changes and numerous embodiments, exemplary embodiments will be illustrated in the drawings and described in detail in the written description. An effect and a characteristic of the invention, and a method for accomplishing these will be apparent when exemplary embodiments described below in detail are referred together with the drawings. However, the invention is not limited to exemplary embodiments described below and may be implemented in various forms.

It will be understood that when an element or a layer is referred to as being "on" another element or another layer, the element can be directly on the other element or layer, or intervening elements may be present thereon. In contrast, it will be understood that when an element or a layer is referred to as being "directly on" another element or another layer, intervening elements are not present thereon. "and/or" includes each of referred components and all combination of one or more components.

Furthermore, relative terms, such as "below", "beneath", "lower", "above", "upper", etc., which are spatially relative terms, may be used to easily describe position relation between one device or components and another device or other components as illustrated in the drawings. When a spatially relative term is used in addition to a direction illustrated in the drawings, the term should be understood as a term including different directions of the device.

While such terms as "first," "second," etc., may be used to describe various components, such components must not be limited to the above terms. The above terms are used only to distinguish one component from another. Therefore, a first component referred below may be a second component within the scope of the invention.

The singular forms "a," "an" and "the" are intended to include the plural forms as well, unless the context clearly indicates otherwise. "Or" means "and/or." As used herein, the term "and/or" includes any and all combinations of one or more of the associated listed items. It will be further understood that the terms "comprises" and/or "comprising" used herein specify the presence of stated features or components, but do not preclude the presence or addition of one or more other features or components.

Exemplary embodiments are described with reference to ideal schematic plan views and cross-sectional views. The shape of an exemplary view may be transformed by a manufacturing technology and/or a tolerance, etc. Exemplary embodiments are not limited to illustrated specific forms but include changes of a form generated depending on a manufacturing process. Therefore, regions exemplified in the drawings have a schematic attribute, and the shape of regions exemplified in the drawings is for exemplifying a specific shape of a region of a device, and not for limiting the scope of the invention.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments are described in detail with reference to the accompanying drawings. Like reference numerals are used for like or corresponding elements when description is made with reference to the drawings, and repeated description thereof is omitted.

FIG. 1 is a block diagram illustrating an exemplary embodiment of a thin film transistor substrate 100 according to the invention.

Referring to FIG. 1, the thin film transistor substrate 100 includes a display area 120 in which a pixel is disposed and at which an image is displayed, and a non-display area 110 disposed in the periphery of the display area 120 and at which an image is not displayed. The thin film transistor substrate 100 may be referred to as a display panel.

A plurality of pixels, a plurality of gate lines GL1-GLn, and a plurality of data lines DL1-DLm are disposed in the display area 120.

The pixels are arranged in a matrix form in the display area 120. For example, the pixels may be arranged in "n" rows and "m" columns that cross each other in the top plan view, where "m" and "n" are integers greater than 0. The pixels include disposed therein, a TFTp and a liquid crystal layer. The liquid crystal layer is disposed between a pixel electrode and a common electrode in a cross-sectional thickness direction of such layers.

The gate lines GL1-GLn and the data lines DL1-DLm are insulated from each other and arranged such that they cross each other. The gate lines GL1-GLn are connected to a gate driving unit (not shown) and receive gate signals from the gate driving unit.

The data lines DL1-DLm are connected to a data driving unit (not shown) and receive data voltages from the data driving unit.

The pixels are connected to corresponding gate lines GL1-GLn and corresponding data lines DL1-DLm. The pixels receive data voltages via a corresponding data line among the data lines DL1-DLm in response to gate signals transferred via a corresponding gate line among the gate lines GL1-GLn. The pixels display gray scales corresponding to the data voltages, respectively.

The gate driving unit generates gate signals in response to a gate control signal from a timing controller (not shown), and sequentially provides the gate signals to the pixels via the gate lines GL1-GLn on a row basis.

The data driving unit receives image signals and data control signals from the timing controller. The data driving unit generates analog data voltages respectively corresponding to image signals in response to a data control signal. The data driving unit provides the analog data voltages to the pixels via the data lines DL1-DLm.

The data driving unit may include a plurality of source driving chips (not shown). The source driving chips are connected to the data lines DL1-DLm via data pad electrodes DP1-DPk, where k is m/2.

A selection circuit may be disposed between the data pad electrodes DP1-DPk and the data lines DL1-DLm. The selection circuit may include thin film transistors TFTa of a first row controlled by a first control line CLa and thin film transistors TFTb of a second row controlled by a second control line CLb.

Where the first control line CLa is activated, the thin film transistors TFTa of the first row are turned on and the source driving chips provide data voltages to pixels connected to odd-numbered data lines DL1, DL3, . . . DL(m−1). Where the second control line CLb is activated, the thin film transistors TFTb of the second row are turned on and the source driving chips provide data voltages to pixels connected to even-numbered data lines DL2, DL4, . . . DLm. Therefore, the number k of data pad electrodes DP1-DPk may be a half of the number m of data lines DL1-DLm, and the number of source driving chips used may be reduced by half. Where the number of data pad electrodes DP1-DPk is half of the number m of data lines DL1-DLm, time required for applying data voltages through the data line DL1-DLm and finally to the pixels is reduced by half.

Conventionally, data voltages may be applied to the pixels within one scanning time. However, according to an exemplary embodiment, the data voltages are applied to the pixels of the thin film transistor substrate 100 within one half a scanning time.

To apply the data voltages to the pixels within one half a scanning time, a turn-on current of the thin film transistors TFTa and TFTb is increased. For increasing a turn-on current of the thin film transistors TFTa and TFTb, a channel width of the thin film transistors TFTa and TFTb is increased. When the channel width of the thin film transistors TFTa and TFTb increases, a parasitic capacitance between a gate electrode and a source electrode within the thin film transistors TFTa and TFTb also increases. When the parasitic capacitance increases, a capacitive load increases and thus a resistive-capacitive ("RC") delay increases, such that applying data voltages to the pixels at a faster place is difficult and a relatively large deviation of a kickback voltage occurs due to the capacitive load, for which flicker of a display occurs.

Figure 2:
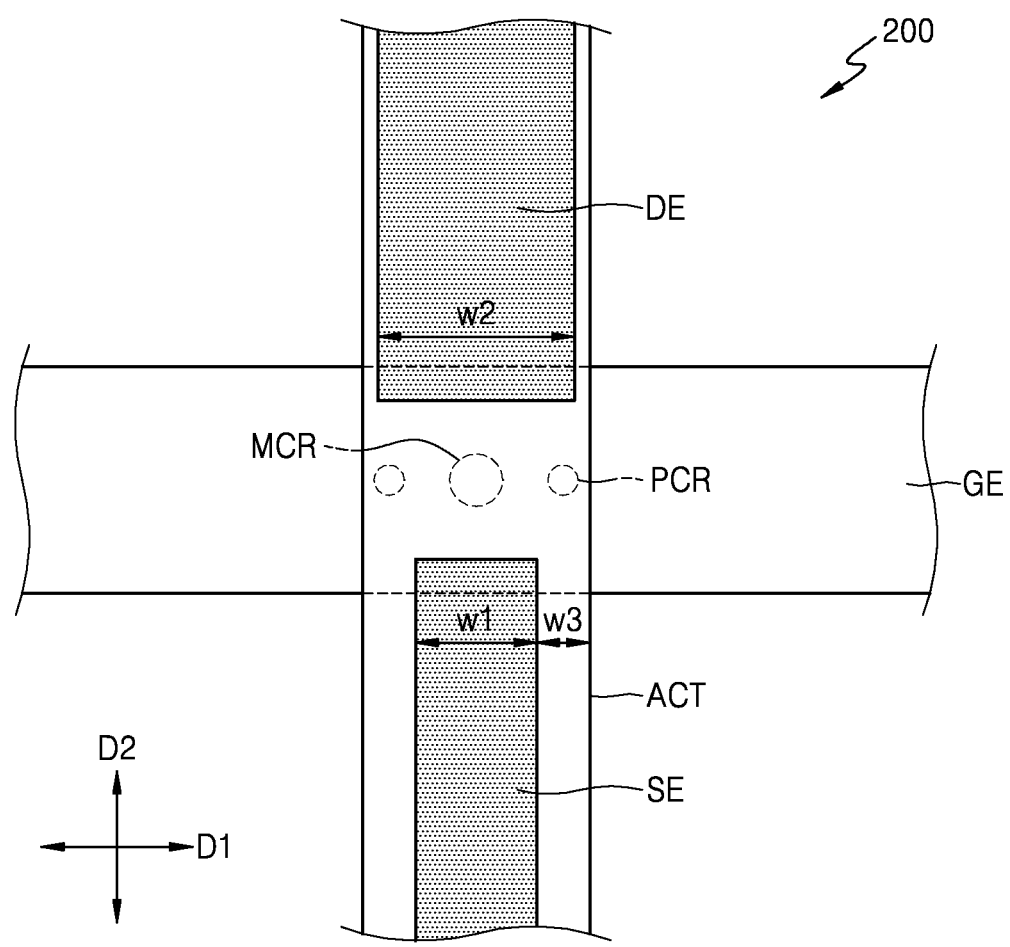
FIG. 2 is a top plan view illustrating an exemplary embodiment of a thin film transistor according to the invention.

FIG. 2 is a plan view illustrating an exemplary embodiment of a thin film transistor 200 according to the invention.

Referring to FIG. 2, the thin film transistor 200 includes a gate electrode GE, an active layer ACT, a source electrode SE and a drain electrode DE.

At the thin film transistor 200, the gate electrode GE is elongated to extend along a first direction D1 on a substrate (not shown) of a TFT substrate. The first direction D1 may be referred to as a channel width direction, and a second direction D2 may be referred to as a channel length direction.

The substrate may be a substrate used for manufacturing a semiconductor device, and for example, may be a glass substrate or a plastic substrate.

The gate electrode GE may include a conductive material and, for example, include metal such as Ti, Pt, Ru, Au, Ag, Mo, Al, W, or Cu, or a conductive oxide such as InZnO (IZO), AlZnO(AZO), and indium tin oxide ("ITO").

At the thin film transistor 200, the active layer ACT is elongated to extend along the second direction D2, disposed on the gate electrode GE, and overlaps the gate electrode GE at least partially. The active layer ACT may include a semiconductor material, and for example, include an oxide semiconductor, an organic semiconductor, Groups 3, 4, and 5 semiconductors such as C, Si, Ge, SiGe, GaN, GaAs, InSb, InP, CdS and a combination thereof. The oxide semiconductor may include, for example, ZnO, ZTO, ZIO, InO, TiO, IGZO or IZTO.

The active layer ACT may have a linear shape in the top plan view. The linear shape may have a predetermined width along the second direction D2. According to an exemplary embodiment, the active layer ACT may include a region thereof that overlaps the gate electrode GE and may have a predetermined width at the region thereof that overlaps the gate electrode GE.

The active layer ACT may be disposed above the gate electrode GE in the cross-sectional thickness direction. However, the active layer ACT is not limited thereto and may be disposed below the gate electrode GE in the cross-sectional thickness direction, that is, disposed between the gate electrode GE and the substrate.

A gate insulating layer (not shown) is disposed between the gate electrode GE and the active layer ACT. The gate insulating layer may include an inorganic insulating material, for example, a silicon oxide or a silicon nitride used for manufacturing a general semiconductor device.

At the thin film transistor 200, the source electrode SE and the drain electrode DE are each disposed on the active layer ACT and are spaced apart from each other to expose a portion of the active layer ACT. The source electrode SE and the drain electrode DE may directly contact the active layer ACT, or may be connected to the active layer ACT via an ohmic contact. The source electrode SE and the drain electrode DE may each include a conductive material. At the thin film transistor 200, the source electrode SE and the drain electrode DE are each elongated to extend along the second direction D2 together with the active layer ACT, but are spaced apart from each other in an area at which the active layer ACT overlaps the gate electrode GE to expose a portion of the active layer ACT. A channel region of the thin film transistor 200 is defined by or at the exposed portion of the active layer ACT.

The active layer ACT may include a source region that overlaps the source electrode SE, a drain region that overlaps the drain electrode DE, and the channel region between the source region and the drain region. The active layer ACT may define the source, drain and channel regions thereof. The active layer ACT may be divided into a transistor region thereof that overlaps the gate electrode GE and a wiring region thereof that does not overlap the gate electrode GE. The transistor region may be divided into and define the source region, the drain region and the channel region. Also, though described below in more detail, the channel region may be divided into a main channel region ("MCR") and a parasitic channel region ("PCR"). Where one dot or point starting inside the overall channel region is extended in a channel length direction (second direction D2) and reaches both the source electrode SE and the drain electrode DE, the one dot may be defined as a dot inside the main channel region. In contrast, where one dot or point starting inside the overall channel region is extended in the channel length direction but does not reach either one of the source electrode SE and the drain electrode DE, the one dot may be defined as a dot inside the parasitic channel region.

In an exemplary embodiment, for example, illustrated in FIG. 2, where the one dot labeled PCR starts inside the overall channel region and is extended in the second direction D2, the extended area reaches the drain electrode DE but does not reach the source electrode SE to define a parasitic channel region of the overall channel region. Where the dot labeled MCR in FIG. 2 starts inside the overall channel region and is extended in the second direction D2, the extended area reaches both the source electrode SE and the drain electrode DE to define the main channel region of the overall channel region. The main channel region of the overall channel region may be defined in the first direction D1 at an entire length of the source electrode SE overlapping the gate electrode GE in the first direction D1. The parasitic channel region of the overall channel region may be a remainder of the overall channel region except for the main channel region.

The source electrode SE and the drain electrode DE each overlap the gate electrode GE at least partially. A portion of the source electrode SE that overlaps the gate electrode GE has a first width w1, and a portion of the drain electrode DE that overlaps the gate electrode GE has a second width w2. The first width w1 of the source electrode SE is less than the second width w2 of the drain electrode DE.

The source electrode SE has the first width w1 along the first direction D1, and the drain electrode DE has the second width w2 along the first direction D1. The first width w1 of the source electrode SE is less than the second width w2 of the drain electrode DE. According to an exemplary embodiment, the first width w1 may be about 70% or less of the second width w2. According to another exemplary embodiment, the first width w1 may be about 60% or less of the second width w2. According to another exemplary embodiment, the first width w1 may be about 50% or less of the second width w2.

According to an exemplary embodiment, at least at one side of the second width w2 of the drain electrode DE, the first width w1 of the source electrode SE may be about 1 micrometer (μm) or more less than the second width w2. According to another exemplary embodiment, the first width w1 may be about 1 μm or more less than the second width w2 at both of opposing sides of the second width w2 of the drain electrode DE. According to another exemplary embodiment, at least at one side of the second width w2 of the drain electrode DE, the first width w1 may be about 2 μm or more less than the second width w2. According to another exemplary embodiment, the first width w1 may be about 2 μm or more less than the second width w2 at both of opposing sides of the second width w2 of the drain electrode DE.

As the first width w1 of the source electrode SE is less than the second width w2 of the drain electrode DE, the parasitic capacitance between the gate electrode GE and the source electrode SE may be reduced. The parasitic capacitance between the gate electrode GE and the source electrode SE may be reduced in proportion to a degree by which the first width w1 of the source electrode SE is smaller than the second width w2 of the drain electrode DE. Though it depends on a material of the active layer ACT, when the second width w2 of the drain electrode DE is 5 μm and the first width w1 of the source electrode SE is reduced from 5 μm to 3 μm, parasitic capacitance reduces by 29% as compared to that when the widths of the source and drain electrodes SE and DE are the same. When the first width w1 of the source electrode SE is reduced, a turn-on current of the thin film transistor 200 is also reduced. The first width w1 and the second width w2 may be a total width of the respective electrode in the channel width direction and overlapping the gate electrode GE.

However, according to an exemplary embodiment, a total width of the active layer ACT in the channel region of the thin film transistor 200 is maintained constant. Where the total width of the active layer ACT in the channel region of the thin film transistor 200 is maintained constant, a peripheral region of the active layer ACT operates as a parasitic channel region. Referring to FIG. 2, a region of the active layer ACT that is located between the source electrode SE and the drain electrode DE operates as the main channel region. However, a turn-on current of the thin film transistor 200 flows through even a region that neighbors the main channel region. The neighboring region may be referred to as a parasitic channel region.

The inventors measured a turn-on current of a TFT while increasing the width of the active layer ACT from a width of the source electrode SE with the width of the source electrode SE fixed. Assuming that a turn-on current of the TFT is 100 when the width of the source electrode SE and the width of the active layer ACT are the same, the turn-on current of the TFT has been about 140 when the width of the active layer ACT has been increased to one side by 1 μm as compared to the width of the source electrode SE. Also, the turn-on current of the TFT has been about 150 when the width of the active layer ACT has been increased to one side by 2 μm compared to the width of the source electrode SE. The turn-on current of the TFT did not further increase even when the width of the active layer ACT is increased to one side by more than 2 μm as compared to the width of the source electrode SE.

The first width w1 of the source electrode SE may be designed to be less than the width w2 of the drain electrode DE based on the above results.

The active layer ACT may extend to at least one side by a third width w3 along the first direction D1 from a portion at which the source electrode SE overlaps the active layer ACT. The third width w3 may be, for example, 1 μm. The third width w3 may be, for example, about 2 μm.

The thin film transistor 200 may be one of the thin film transistors TFTa and TFTb of FIG. 1. The gate electrode GE of the thin film transistor 200 may be connected to one of the first and second control lines CLa and CLb of FIG. 1, or may be defined as a portion of one of the first and second control lines CLa and CLb of FIG. 1. Also, the drain electrode DE of the thin film transistor 200 may be connected to one of the data pad electrodes DP1-DPk, may be connected to one of the data lines DL1-DLm of FIG. 1 and/or may be defined as a portion of one of the data lines DL1-DLm of FIG. 1. The source electrode SE of the thin film transistor 200 may be connected to one of the data lines DL1-DLm of FIG. 1, or may be defined as a portion of one of the data lines DL1-DLm of FIG. 1. As described above, the plurality of pixels are connected to the data lines DL1-DLm, respectively, and data voltages are respectively applied to the plurality of pixels via their corresponding data lines DL1-DLm.

Figure 3:
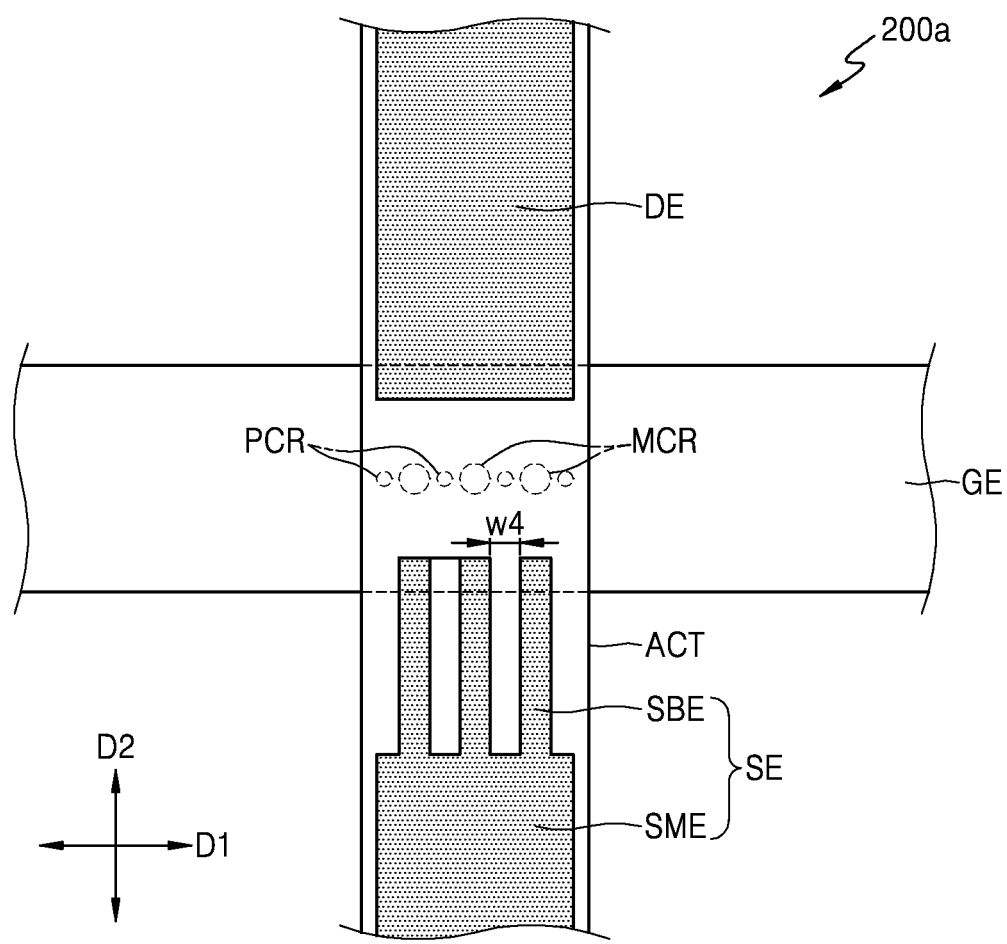
FIG. 3 is a plan view illustrating another exemplary embodiment of a thin film transistor according to the invention.

FIG. 3 is a plan view illustrating another exemplary embodiment of a thin film transistor 200a according to the invention.

Referring to FIG. 3, the thin film transistor 200a includes a gate electrode GE, an active layer ACT, a source electrode SE and a drain electrode DE.

At the thin film transistor 200a, the gate electrode GE is elongated to extend along a first direction D1 on a substrate (not shown) of a TFT substrate. The first direction D1 may be referred to as a channel width direction, and a second direction D2 may be referred to as a channel length direction.

The gate electrode GE may include a conductive material.

The active layer ACT is elongated to extend along the second direction D2 on the gate electrode GE, and overlaps the gate electrode GE at least partially. The active layer ACT may include a semiconductor material, and for example, include an oxide semiconductor, an organic semiconductor, Groups 3, 4, and 5 semiconductors, and a compound thereof. The oxide semiconductor may include, for example, IGZO.

The active layer ACT may have a linear shape in the top plan view, having a predetermined width along the second direction D2. According to an exemplary embodiment, the active layer ACT may have a predetermined width in a region thereof that overlaps the gate electrode GE. A gate insulating layer (not shown) is disposed between the gate electrode GE and the active layer ACT.

At the source electrode 200a, the source electrode SE and the drain electrode DE are each disposed on the active layer ACT and spaced apart from each other to expose a portion of the active layer ACT. The source electrode SE and the drain electrode DE overlap the gate electrode GE at least partially. The source electrode SE and the drain electrode DE may include a conductive material. The source electrode SE and the drain electrode DE are each elongated to extend along the second direction D2, but are spaced apart from each other in an area at which the active layer ACT to expose the active layer ACT. A channel region of the thin film transistor 200a is defined by or at the exposed portion of the active layer ACT.

The active layer ACT may include a source region that overlaps the source electrode SE, a drain region that overlaps the drain electrode DE, and the channel region between the source region and the drain region. The active layer ACT may define the source, drain and channel regions thereof. The active layer ACT may be divided into and define a transistor region thereof that overlaps the gate electrode GE and a wiring region thereof that does not overlap the gate electrode GE. The transistor region may be divided into and define the source region, the drain region and the channel region. Also, the channel region may be divided into a main channel region ("MCR") and a parasitic channel region ("PCR").

The source electrode SE may include source branch electrodes SBE and a source main electrode SME. Though the source electrode SE is illustrated as including three source branch electrodes SBE in FIG. 3, this is exemplary, and the source electrode SE may include two or more source branch electrodes SBE depending on the width of the source electrode SE in the first direction D1 and the width of the source branch electrodes SBE in the first direction D1.

The source branch electrodes SBE may be connected to the source main electrode SME in common. Portions of the source electrode SE define the source branch electrodes SBE and the source main electrode SME. Each of the source branch electrodes SBE may overlap the gate electrode GE at least partially. Distal ends of each of the source branch electrodes SBE may overlap the gate electrode GE. Though only the source electrode SE is illustrated as defining the source branch electrodes SBE and the source main electrode SME in FIG. 3, the drain electrode DE may also define drain branch electrodes (not shown) and a drain main electrode to which the drain branch electrodes are commonly connected. According to another exemplary embodiment, the drain electrode DE may include drain branch electrodes (not shown) and a drain main electrode to which the drain branch electrodes are commonly connected.

The source branch electrodes SBE may be spaced apart from each other by a fourth width w4 along the first direction D1. According to an exemplary embodiment, the fourth width may be about 1 μm. According to another exemplary embodiment, the fourth width may be about 2 μm. A total width of the source electrode SE may be defined by a total of the widths of the source branch electrodes SBE in the channel width direction and overlapping the gate electrode GE.

Main channel region portions may be defined as regions of the active layer ACT channel region disposed between the source branch electrodes SBE and the drain electrode DE. Parasitic channel region portions may be defined as portions of the active layer ACT channel region that are located between the main channel region portions. The parasitic channel regions may be limited by space regions between the source branch electrodes SBE.

In an exemplary embodiment, for example, illustrated in FIG. 3, where the dots labeled PCR start inside the overall channel region and are extended in the second direction D2, the extended areas reach the drain electrode DE but do not reach the source branch electrodes SBE to define parasitic channel region portions of the overall channel region. Where the dots labeled MCR in FIG. 3 start inside the overall channel region and are extended in the second direction D2, the extended areas reach both the source branch electrodes SBE and the drain electrode DE to define main channel region portions of the overall channel region. The main channel region portions of the overall channel region may be defined in the first direction D1 at each length of the source branch electrodes SBE overlapping the gate electrode GE in the first direction D1. The parasitic channel region portions of the overall channel region may be a remainder of the overall channel region except for the main channel region portions.

As illustrated in FIG. 3, the gate electrode GE overlaps only a portion of the source branch electrodes SBE among portions defined by the overall source electrode SE. Therefore, the parasitic capacitance between the gate electrode GE and the source electrode SE may be reduced. Since the parasitic channel region portions of the active layer ACT overall channel region are generated adjacent the main channel region portions of the active layer ACT overall channel region, the thin film transistor 200a may output a turn-on current of a sufficient magnitude.

The thin film transistor 200a may be one of the thin film transistors TFTa and TFTb of FIG. 1. The gate electrode GE of the thin film transistor 200a may be connected to one of the first and second control lines CLa and CLb of FIG. 1, or may be defined as a portion of one of the first and second control lines CLa and CLb of FIG. 1. Also, the drain electrode DE of the thin film transistor 200a may be connected to one of the data pad electrodes DP1-DPk of FIG. 1. The source electrode SE of the thin film transistor 200a may be connected to one of the data lines DL1-DLm of FIG. 1, or may be defined as a portion of one of the data lines DL1-DLm of FIG. 1. As described above, the plurality of pixels are connected to the data lines DL1-DLm, respectively, and data voltages are respectively applied to the plurality of pixels via the corresponding data lines DL1-DLm.

Figure 4:
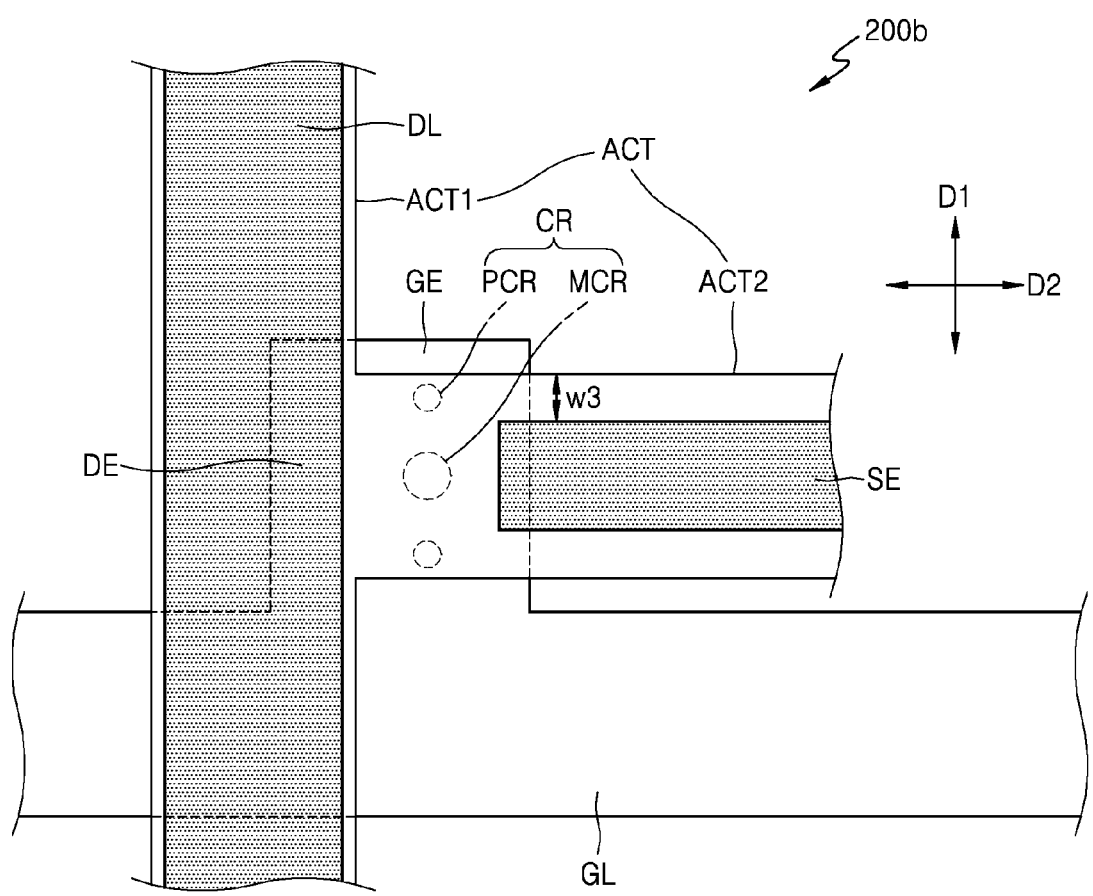
FIG. 4 is a plan view illustrating still another exemplary embodiment of a thin film transistor according to the invention.

FIG. 4 is a plan view illustrating still another exemplary embodiment of a thin film transistor 200b according to the invention.

Referring to FIG. 4, the thin film transistor 200b includes a gate electrode GE, an active layer ACT, a source electrode SE and a drain electrode DE. The thin film transistor 200b may be the thin film transistor TFTp included in the pixel of FIG. 1.

At the thin film transistor 200b, the gate electrode GE protrudes along a first direction D1 from a main portion of a gate line GL which is elongated to extend along a second direction D2 on a substrate (not shown) of a thin film transistor substrate. The gate electrode GE may be connected to the gate line GL or may be defined by a portion of the gate line GL. The gate electrode GE may include a conductive material. The first direction D1 may be referred to as a channel width direction, and the second direction D2 may be referred to as a channel length direction.

At the thin film transistor 200b, the active layer ACT is disposed on the gate electrode GE and overlaps the gate electrode GE at least partially. The active layer ACT defines a first portion ACT1 thereof elongated to extend along the first direction D1 and a second portion ACT2 thereof elongated to extend along the second direction D2. The active layer ACT overlaps the gate electrode GE between a boundary of the first portion ACT1 thereof and a boundary of the second portion ACT2 thereof. The first portion ACT1 of the active layer ACT may define a drain region of the active layer ACT, and the second portion ACT2 may define a channel region and a source region of the active layer ACT.

The active layer ACT may include a semiconductor material, and for example, include an oxide semiconductor, an organic semiconductor, Groups 3, 4, and 5 semiconductors, and a compound thereof. The oxide semiconductor may include, for example, IGZO. A gate insulating layer (not shown) is disposed between the gate electrode GE and the active layer ACT.

At the thin film transistor 200b, the source electrode SE and the drain electrode DE are disposed on the active layer ACT and spaced apart from each other to expose a portion of the active layer ACT. The drain electrode DE is disposed on the first portion ACT1 of the active layer ACT, and the source electrode SE is disposed on the second portion ACT2 of the active layer ACT. The source electrode SE and the drain electrode DE overlap the gate electrode GE at least partially. The source electrode SE and the drain electrode DE may include a conductive material.

The drain electrode DE may be connected to a data line DL, or may be defined by a portion of the data line DL. The source electrode SE may be connected to a pixel electrode of a pixel illustrated in FIG. 1. Though not shown, a pixel electrode is disposed on the drain electrode DE and the source electrode SE. An interlayer insulating layer (not shown) may be disposed between the pixel electrode and the drain electrode DE and between the pixel electrode and the source electrode SE.

As illustrated in FIG. 4, the source electrode SE has a terminal end that overlaps the gate electrode GE and the active layer ACT. In FIG. 4, the terminal end of the source electrode SE may be defined at a left edge or edges located on the left side in the top plan view. At the terminal end of the source electrode SE, the active layer ACT may extend from at least one side of the soured electrode SE by at least a third width w3 in the first direction D1. According to an exemplary embodiment, the third width w3 may be about 1 μm. According to another exemplary embodiment, the third width w3 may be about 2 μm.

According to an exemplary embodiment, as illustrated in FIG. 4, at the terminal end of the source electrode SE, the active layer ACT may extend from both of opposing sides of the source electrode SE by at least the third width w3 in the first direction D1. The third width w3 may be about 1 μm. According to another exemplary embodiment, the third width w3 may be about 2 μm.

As illustrated in FIG. 4, a channel region ("CR") collectively includes a main channel region ("MCR") and a parasitic channel region ("PCR"). The main channel region is limited by the terminal end of the source electrode SE and an edge of the drain electrode DE. A channel width of the main channel region may be the same as the length of the terminal end edge of the source electrode SE in the first direction D1. The parasitic channel region may be limited by the active layer ACT extended from at least one side of the source electrode SE by at least the third width w3 in the first direction D1.

Since a portion of the overall channel region is the parasitic channel region, the parasitic capacitance between the gate electrode GE and the source electrode SE may be reduced and the thin film transistor 200b may output a turn-on current of a sufficient magnitude.

Figure 5:
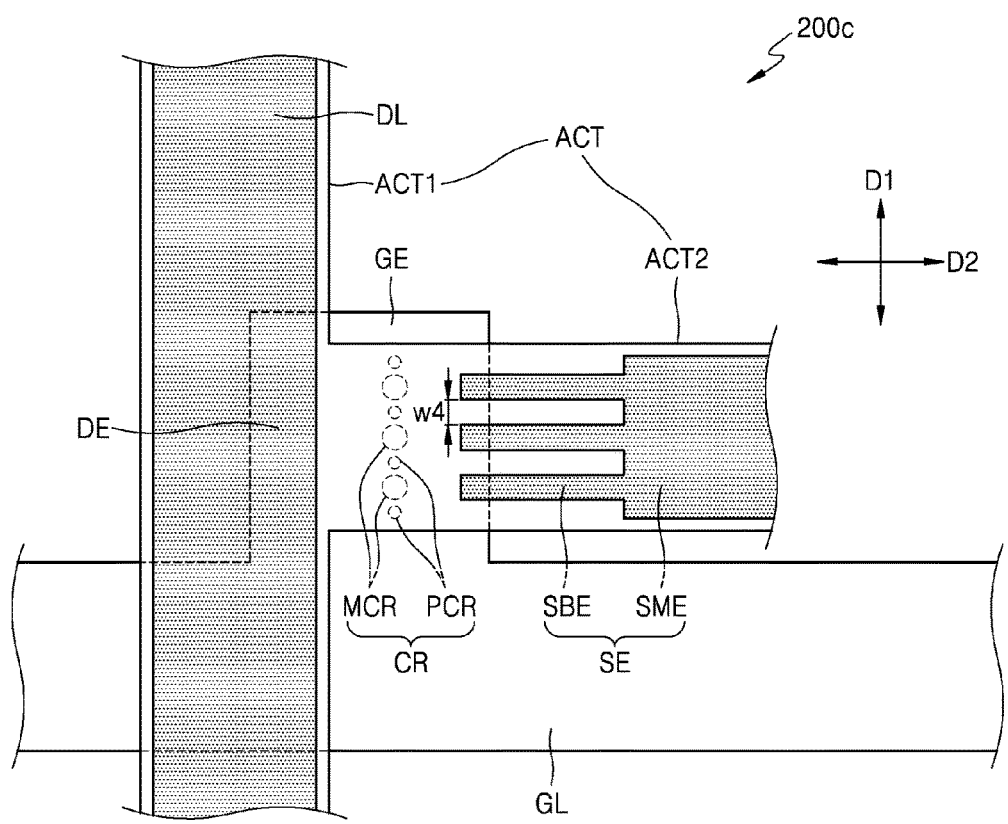
FIG. 5 is a plan view illustrating yet another exemplary embodiment of a thin film transistor according to the invention.

FIG. 5 is a plan view illustrating yet another exemplary embodiment of a thin film transistor 200c according to the invention.

Referring to FIG. 5, the thin film transistor 200c includes a gate electrode GE, an active layer ACT, a source electrode SE and a drain electrode DE. The thin film transistor 200c may be the thin film transistor TFTp included in the pixel of FIG. 1.

At the thin film transistor 200c, the gate electrode GE protrudes along a first direction D1 from a main portion of a gate line GL which is elongated to extend along a second direction D2. The gate electrode GE may be connected to the gate line GL or may be defined by a portion of the gate line GL. The first direction D1 may be referred to as a channel width direction, and the second direction D2 may be referred to as a channel length direction.

At the thin film transistor 200c, the active layer ACT is disposed on the gate electrode GE and overlaps the gate electrode GE at least partially. The active layer ACT defines a first portion ACT1 thereof elongated to extend along the first direction D1 and a second portion ACT2 thereof elongated to extend along the second direction D2. The active layer ACT overlaps the gate electrode GE between a boundary of the first portion ACT1 thereof and a boundary of the second portion ACT2 thereof. The first portion ACT1 of the active layer ACT may define a drain region of the active layer ACT, and the second portion ACT2 may define a channel region and a source region of the active layer ACT. The active layer ACT may include a semiconductor material.

At the thin film transistor 200c, the drain electrode DE is disposed on the first portion ACT1 of the active layer ACT, and the source electrode SE is disposed on the second portion ACT2 of the active layer ACT. The source electrode SE and the drain electrode DE overlap the gate electrode GE at least partially.

The drain electrode DE may be connected to a data line DL, or may be defined by a portion of the data line DL. The source electrode SE may be connected to a pixel electrode of a pixel illustrated in FIG. 1.

As illustrated in FIG. 5, the source electrode SE may define source branch electrodes SBE thereof and a source main electrode SME thereof. Though the source electrode SE is illustrated as defining three source branch electrodes SBE thereof in FIG. 5, this is exemplary, and the source electrode SE may define two or more source branch electrodes SBE thereof depending on the width of the source electrode SE in the first direction D1 and the width of the source branch electrodes SBE in the first direction D1.

The source branch electrodes SBE may be connected to the source main electrode SME in common. Each of the source branch electrodes SBE may overlap the gate electrode GE at least partially.

The source branch electrodes SBE may be spaced apart from each other by a fourth width w4 along the first direction D1. According to an exemplary embodiment, the fourth width may be about 1 μm. According to another exemplary embodiment, the fourth width may be about 2 μm.

The channel region ("CR") collectively includes a main channel region ("MCR") and a parasitic channel region ("PCR"). Main channel region portions may be defined as regions of the active layer ACT between the source branch electrodes SBE and the drain electrode DE. Parasitic channel region portions may be defined as portions of the active layer ACT that are located between the main channel region portions. The parasitic channel region portions may be limited by space regions between the source branch electrodes SBE.

As illustrated in FIG. 5, the gate electrode GE overlaps only a distal end portion of the source branch electrodes SBE among portions defined by the overall source electrode SE. Therefore, the parasitic capacitance between the gate electrode GE and the source electrode SE may be reduced. Since the parasitic channel region portions of the active layer ACT overall channel region are generated adjacent the main channel region portions of the overall active layer ACT channel region, the thin film transistor 200c may output a turn-on current of a sufficient magnitude.

While one or more exemplary embodiments have been described with reference to the figures, it will be understood by those of ordinary skill in the art that various changes in form and details may be made therein without departing from the spirit and scope as defined by the following claims.

What is claimed is:

1. A thin film transistor substrate comprising:
   a substrate; and
   a thin film transistor comprising a gate electrode on the substrate, an active layer on the gate electrode, and a source electrode and a drain electrode on the active layer,
   wherein within the thin film transistor,
   the source electrode defines a branch electrode thereof in plural and a main electrode from which the branch electrodes are extended in parallel along a first direction toward the drain electrode,
   the main electrode of the source electrode is extended along the first direction,
   the branch electrodes of the source electrode respectively define terminal ends thereof each of which faces the drain electrode in the first direction and overlaps the gate electrode,
   the branch electrodes of the source electrode are spaced apart from each other in a second direction that crosses the first direction,
   a total width of the branch electrodes of the source electrode is less than a width of the main electrode of the source electrode, and
   the total width of the branch electrodes and the width of the main electrode are defined in the second direction.

2. The substrate of claim 1, wherein within the thin film transistor,
   the branch electrodes are spaced apart from each other by at least about 1 micrometer in the second direction.

3. The substrate of claim 1, wherein within the thin film transistor,
   the branch electrodes are spaced apart from each other by at least about 2 micrometers in the second direction.

4. The substrate of claim 1, wherein within the thin film transistor, the active layer defines in the second direction:
   main channel regions thereof having channel widths respectively defined by widths of the branch electrodes, and
   parasitic channel regions thereof defined between the main channel regions.

5. The substrate of claim 1, wherein within the thin film transistor, the drain electrode defines a drain branch electrode thereof in plural and a drain main electrode from which the drain branch electrodes are extended in parallel along the first direction toward the source electrode.

6. The substrate of claim 1, further comprising:
   a pixel comprising the thin film transistor and a pixel electrode which is connected to the source electrode of the thin film transistor; and
   a data line which is connected to the drain electrode of the thin film transistor and applies a data voltage to the pixel.

7. The substrate of claim 1, further comprising:
   a data line connected to the source electrode of the thin film transistor; and
   a plurality of pixels each connected to the data line.

8. A thin film transistor substrate comprising:
   a substrate;
   a control line which extends along a first direction on the substrate, a portion of the control line defining a gate electrode of the control line;
   an active layer extending along a second direction that is different from the first direction, a portion of the active layer overlapping the gate electrode of the control line and defining a channel region of the active layer;
   a data line on the active layer and extending along the second direction, portions of the data line defining a drain electrode and a source electrode, the drain and source electrodes spaced apart from each other at the channel region in the second direction, and
   a selection thin film transistor comprising the gate electrode on the substrate, the channel region of the active layer, the source electrode and the drain electrode
   wherein within the selection thin film transistor,
   at the channel region, a terminal end of the source electrode faces a terminal end of the drain electrode in the second direction, and, a total first width of the terminal end of the source electrode in the first direction is less than a total second width of the terminal end of the drain electrode in the first direction.

9. The substrate of claim 8, wherein the first width is less than the second width by at least about 1 micrometer.

10. The substrate of claim 8, wherein the first width is less than the second width by at least about 2 micrometers.

11. The substrate of claim 8, wherein the channel region of the active layer has a constant width defined in the first direction, along the second direction.

12. The substrate of claim 8, further comprising a plurality of pixels each connected to the data line.

13. The substrate of claim 8,
wherein at the terminal end of the source electrode, the channel region of the active layer extends further than at least one side of the terminal end of the source electrode by at least about 1 micrometer in the first direction.

14. The substrate of claim 13, wherein at the terminal end of the source electrode, the channel region of the active layer extends further than both of opposing sides of the terminal end of the source electrode by at least about 1 micrometer in the first direction.

15. The substrate of claim 13, wherein at the terminal end of the source electrode, the channel region of the active layer extends further than at least one side of the terminal end of the source electrode by at least about 2 micrometers in the first direction.

16. The substrate of claim 13, wherein within the thin film transistor, the channel region of the active layer defines in the first direction:
 a main channel region thereof having a width defined by a width of the terminal end of the source electrode, and
 a parasitic channel region thereof disposed adjacent to the main channel region and corresponding to a portion of the channel region which is extended from at least one side of the terminal end of the source electrode.

\* \* \* \* \*